United States Patent [19]

Dolan et al.

[11] Patent Number: 5,606,220
[45] Date of Patent: Feb. 25, 1997

[54] VISIBLE LAMP INCLUDING SELENIUM OR SULFUR

[75] Inventors: James T. Dolan, Frederick; Michael G. Ury, Bethesda; Charles H. Wood, Rockville, all of Md.

[73] Assignee: Fusion Systems Corporation, Rockville, Md.

[21] Appl. No.: 370,037

[22] Filed: Jan. 9, 1995

Related U.S. Application Data

[63] Continuation of Ser. No. 71,027, Jun. 3, 1993, Pat. No. 5,404,076, which is a continuation of Ser. No. 604,487, Oct. 25, 1990, abandoned.

[51] Int. Cl.⁶ .......................... H01J 17/20; H01J 61/12; H01J 61/18
[52] U.S. Cl. .................. 313/637; 313/572; 313/638; 313/643; 315/248
[58] Field of Search ...................... 313/550, 572, 313/637, 638, 643; 315/248

[56] References Cited

U.S. PATENT DOCUMENTS

| | | |
|---|---|---|
| 3,234,421 | 2/1966 | Reiling . |
| 3,748,520 | 7/1973 | Silver . |
| 3,764,843 | 10/1973 | Van Eijl et al. . |
| 3,873,884 | 3/1975 | Gabriel . |
| 3,984,727 | 10/1976 | Young . |
| 4,427,922 | 1/1984 | Proud et al. . |
| 4,476,413 | 10/1984 | Gough et al. . |
| 4,495,440 | 2/1985 | Schlitt et al. . |
| 4,532,427 | 7/1985 | Matthews et al. . |
| 4,683,525 | 7/1987 | Camm . |
| 4,810,938 | 3/1989 | Johnson et al. . |
| 4,937,503 | 6/1990 | Sigai et al. . |
| 4,945,290 | 7/1990 | Eliasson et al. . |
| 5,404,076 | 4/1995 | Dolan et al. ............ 313/637 |

FOREIGN PATENT DOCUMENTS

| | | |
|---|---|---|
| 55-10755 | 1/1980 | Japan . |
| 55-95265 | 7/1980 | Japan . |
| 1282239 | 7/1987 | U.S.S.R. . |

OTHER PUBLICATIONS

"Radiative Efficiencies of Radio Frequency Sulfur Discharges", by K. J. N. Badura and J. T. Verdeyen, *IEEE Journal of Quantum Electronics*, vol. QE–21, No. 7, Jul. 1985, pp. 748–750.
"Stable Pure Sulfur Discharges and Associated Spectra", by D. A. Peterson and L. A. Schlie, *J. Chem. Phys.* 73(4), 15 Aug. 1980, pp. 1551–1566.
"Technique For Measuring Rotational Temperature of Microwave Excited Diatomic Sulfur", by V. E. Merchant and M. L. Andrews, *Applied Optics*, 15 Sep. 1980, vol. 19, No. 18, pp. 3113–3117.
"Detection of Sulfur Dimers in $SF_6$ and $SF_6/O_2$ Plasma–Etching Discharges", by K. E. Greenberg and P. J. Hargis, Jr., *Appl. Phys. Lett.* 54(14), 3 Apr. 1989, pp. 1374–1376.
*The Identification of Molecular Spectra*, by R. W. B. Pearse and A. G. Gaydon, John Wiley & Sons, Inc., New York, 1976, pp. 293–297.
Patent Abstracts of Japan, vol. 4, No. 40 (E–004), Mar. 28, 1980 relating to JP–A–55 010 755 (Ushio Inc), Jan. 25, 1980.
Childs et al., "Some Characteristics of Low Pressure, Sulfur, Microwave–Excited, Electrodeless Discharge Lamps", Applied Spectroscopy, vol. 30, No. 5, pp. 507–509, 1976, Baltimore US.
Bentley et al., "Preparation of Electrodeless Discharge Lamps For Elements Forming Gaseous Covalent Hydrides", Analytical Chemistry, vol. 49, No. 4, Apr. 1977, pp. 551–554, Columbus US.

*Primary Examiner*—Nimeshkumar Patel
*Attorney, Agent, or Firm*—Pollock, Vande Sande & Priddy

[57] ABSTRACT

A lamp for providing visible light which utilizes a fill containing selenium and/or sulfur, or compounds of these substances. The lamp is excited such that the excited fill emits radiation from elemental selenium and/or elemental sulfur which is in a continuous band principally within the visible range.

16 Claims, 2 Drawing Sheets

VISIBLE LAMP INCLUDING SELENIUM OR SULFUR

CROSS-REFERENCES TO RELATED APPLICATIONS

The present application is a continuation of Application Ser. No. 08/071,027, Jun. 3, 1993 now U.S. Pat No. 5,404,076, which is a continuation of application Ser. No. 07/604,487, now abandoned, filed Oct. 25, 1990.

BACKGROUND OF THE INVENTION

The present invention is directed to a new, high power lamp.

High power lamps are used for many illumination applications. The incandescent and fluorescent lamps, so familiar in homes and offices, do not provide enough illumination for many commercial and industrial applications. In fact, the lamp which has gained acceptance and which is typically used for high power illumination is known as the high intensity discharge (HID) lamp. This lamp is simple in structure, and generally consists of a glass envelope which contains two electrodes and a fill which vaporizes and becomes a gas when the lamp is operated.

The fill in the HID lamp usually contains mercury as its primary component. However, this is undesirable because mercury is a highly toxic and environmentally hazardous substance. Thus, if a HID lamp should break, dangerous mercury fumes would be emitted, and after the useful life of the lamp is over, there is no easy way to safely dispose of the mercury containing envelope. The widespread use of mercury containing lamps has been recognized as a serious environmental problem.

It is a feature of the present invention that instead of mercury, a substance which contains sulfur or selenium is used in the lamp fill.

SUMMARY OF THE INVENTION

In accordance with a first aspect of the present invention, the elemental sulfur or selenium, or compounds of these elements, is included in a lamp fill. The fill is present at a pressure of at least about 1 atmosphere, and is excited with electromagnetic energy at a relatively high power density. Each of the above-mentioned substances has a low vapor pressure at room temperature, yet a high vapor pressure at typical lamp operating temperatures. The preferred embodiment of the invention utilizes a sulfur fill.

In accordance with a further aspect of the invention, elemental sulfur or selenium, or compounds of these elements is used as the primary radiating component of a lamp fill. The term "primary radiating component" as used herein means that radiating component of the fill which is present at at least about the same or greater partial pressure than the other radiating fill components during operation of the lamp, or that radiating component which is the sole radiating component in the fill.

There are many ways to measure how good a lamp is, and amongst those skilled in the lamp art the use of various standardized performance indicators has arisen. These include the luminous efficacy of the lamp, its rated life, lumen maintenance, chromaticity, and color rendering index (CRI). Finally, the stability of the color of the light which is emitted by the lamp is important, as this may change over time. The closer these accepted indicators are to ideal, the better the performance of the lamp.

As described above, the lamp of the invention avoids the environmental hazards which are associated with mercury based lamps, and additionally the resultant performance indicators for the lamp are relatively good.

In a first embodiment of the invention, a high power lamp of the electrodeless type is provided, which is powered by microwave energy. High power electrodeless lamps are well known in the art, but have inevitably if not always contained a mercury fill. Additionally, the lamps have primarily been used for their output in the ultraviolet rather than the visible portion of the spectrum. In the electrodeless lamp of the invention, a high pressure fill at least as high as 1 atmosphere is utilized, which includes sulfur or selenium, or a compound thereof. Additionally, the fill may include a gas such as argon or xenon. The high pressure fill is excited at power densities in excess of 50 watts/cc, and preferably in excess of 100 watts/cc. Furthermore, various additives such as metal halides, arsenic or Boron, may be included in the fill to emphasize different areas of the spectrum.

The efficiency of production of useful radiation of the lamp of the invention is relatively high. In fact, it is significantly higher than for the conventional electrodeless lamp which utilizes a mercury fill. The ability to provide such a lamp is an unexpected result, as the fill substances used in accordance with the invention have a higher heat conductivity than mercury so that it would be expected that more heat would be lost to the bulb walls, and that the efficiency of production of useful radiation would be lower than with the mercury lamp.

In a further embodiment of the invention, an arc lamp which has electrodes is provided. This is similar to the previously described mercury containing HID lamp, but instead of mercury, the fill includes a sulfur or selenium containing substance. As in the case of the electrodeless lamp, the addition of additives to the fill may be used to emphasize particular spectral regions. For example, sodium might be used to increase the orange and red radiation from the lamp.

In the prior art, low pressure, low power lamps are known which have been used in the laboratory for the scientific study of the spectrum (atomic spectroscopy). It is conventional in such laboratory to use each of the elements of the periodic table, including the fill substances proposed herein, as the fill for electrodeless and arc lamps, so as to generate the atomic and molecular spectra of such elements. However, such lamps would be wholly unsuitable as high power visible, illumination sources. In fact, when the spectra generated with the lamps of the present invention were compared with the atomic or molecular spectrum generated by the low power, low pressure atomic spectroscopy lamp using the same fill, it was noted that for at least some implementations of the present invention, the ultraviolet part of the spectrum which appeared prominently in the spectrum of the atomic spectroscopy source was substantially and unexpectedly suppressed in the lamp of the invention, thus resulting in higher luminous efficacy, and in the generation of less harmful ultraviolet radiation.

It is thus an advantage of the present invention that a new, high power lamp is provided which does not need to contain mercury.

It is a further advantage of the invention that a new, high power lamp bulb is provided which does not need to contain mercury.

It is a further advantage of the invention that a new, high power lamp is provided which has relatively good performance indicators.

BRIEF DESCRIPTION OF THE DRAWINGS

The invention will be better appreciated by referring to the accompanying drawings, wherein.

DETAILED DESCRIPTION OF PREFERRED EMBODIMENTS

Figure 1:
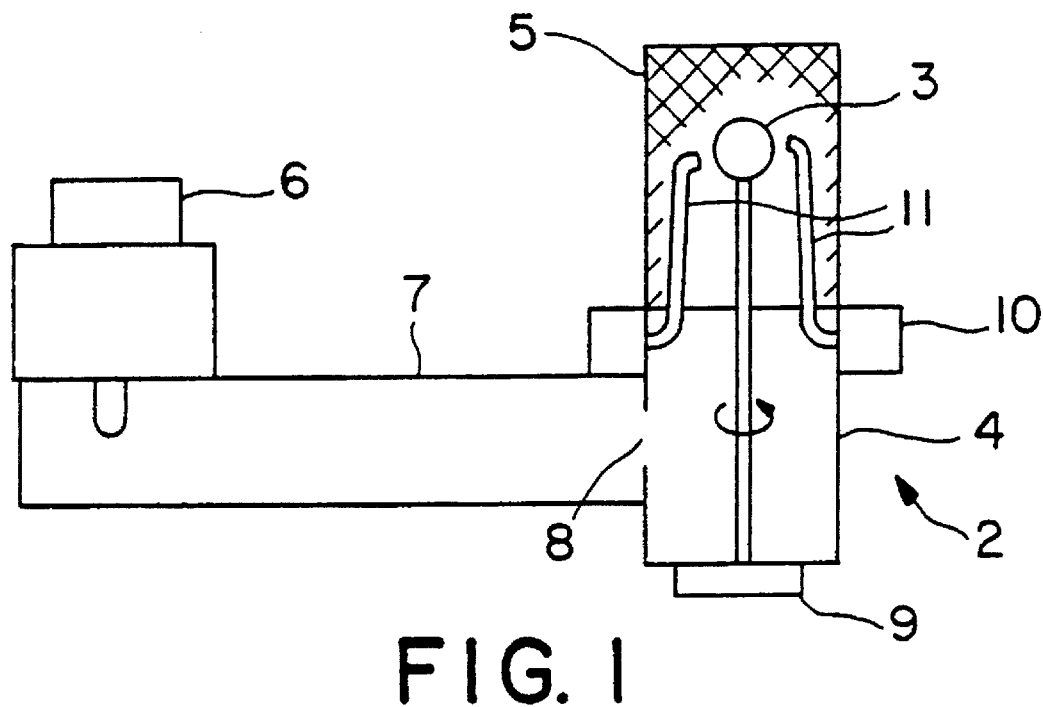
FIG. 1 shows a first embodiment of the invention.

Referring to FIG. 1, a first embodiment of the invention is depicted. Lamp 2 is an electrodeless lamp which is powered by microwave energy. Bulb 3, which contains a high pressure fill, and is made of quartz or other suitable material, is supported in a microwave cavity, which is comprised of conductive housing 4 and mesh 5. Magnetron 6 generates microwave energy, which is fed by waveguide 7, to coupling slot 8 of the microwave cavity.

This excites the bulb fill to a plasma state, whereupon light is emitted by the fill, which is transmitted out of the cavity through mesh 5. The mesh is metallic, and is constructed so that it is substantially opaque to microwave energy, while being substantially transparent to the light which is emitted by bulb 3. The bulb is rotated by rotator 9, and the bulb envelope is cooled by gas which is fed in to plenum 10 and out through nozzles 11.

In accordance with an aspect of the invention, the fill in bulb 4 includes elemental sulfur or selenium, or a compound of one of these elements. In accordance with a further aspect of the invention, this substance is present as the primary radiating component of the bulb fill. It is further desirable to use a fill component which aids in starting the discharge, and for example, a small amount of an inert gas, such as argon or xenon may be used for this purpose.

The lamp which is shown in FIG. 1 may be characterized as a high power, high pressure lamp. Thus, the fill in bulb 3 is present in amounts such that the fill pressure is at least one atmosphere or above at operating temperature, and is preferably 2 to 20 atmospheres. Additionally, the amplitude of the microwave energy which is fed to the cavity is such that the power density of the energy which is coupled to the fill is at least 50 watts/cc, and preferably in the range of 100 to 400 watts/cc. It should be understood that the absolute amount of the primary fill component in solid form which is used in the bulb may vary depending on which substance is used, e.g., sulfur or selenium, but the amount always will be such to produce the desired pressure range at operating temperature, i.e., the temperature of the bulb during normal operation at a power density of 50 watts/cc or greater. The fill pressure is mainly controlled by the primary fill component, which typically has a substantially higher partial pressure than that of the inert gas when the lamp is operational. Further, the illumination provided by the lamp shown in FIG. 1 may be augmented in various regions of the spectrum by including certain additives in the fill. By way of non-limitative examples such additives may include metal halides, arsenic, boron, carbon and bismuth. Examples of some of the many metal halides which can be used are $CdI_2$, $HgCl$, and $InI_3$. Also, in certain implementations, the addition of some mercury may improve operation by reducing the restrike time of the lamp.

As noted above, in addition to using sulfur, selenium, and phosphorous in elemental form, compounds of these elements may be used. For example, $CS_2$, $InS$, $As_2S_3$, $SeO_2$ and $SeCl_4$ as well as other compounds of sulfur and selenium, may be used. The term "a sulfur containing substance" as used herein, includes both elemental sulfur and sulfur compounds, while the same is true for the corresponding terms as applied to selenium. It should be appreciated that the primary radiating component of the fill may be comprised of a combination of a sulfur containing substance or substances and selenium containing substance, rather than only one of these substances. Additionally, the primary radiating component may be comprised of a mixture of the elemental form and a compound(s) of a particular substance, e.g., sulfur.

While microwave energy is the preferred mode of excitation of lamp 2, it would also be possible to provide excitation with electromagnetic energy in the radio frequency range. Since this typically would involve wrapping an excitation coil around the bulb, which would obscure some of the emitted light, the microwave mode of excitation is preferred. However, the term "electromagnetic energy" as used herein refers to both microwave and r.f. modes. Also, while the microwave cavity which is illustrated in FIG. 1 does not include a reflector, a reflecting cavity could also be used.

As mentioned above it appears that the performance indicators of the lamp of the invention are relatively good. In this regard it is noted that electrodeless lamps, which have heretofore been used mainly to produce ultraviolet as opposed to visible light, tend to maintain their lumen output at a high level for a longer period of time than arc lamps, and this may be an advantageous property of the electrodeless lamp embodiment of the present invention.

An additional advantage of the present lamp is that the primary radiating fill component may be a single element. Thus, the most common type of HID lamp presently used for high power illumination applications is the metal halide type HID lamp, wherein mercury is combined with the halide of another metal or metals in order to achieve the desired spectral output. A commonly used combination is $Hg+ScI+NaI$. The partial pressure of the additive metals is determined by the amount of metal halide in the lamp and by the temperature of the coldest spot on the lamp. The result is that variations in these parameters due to manufacturing tolerances or lamp aging will cause changes in the partial pressure of the additive, which in turn causes changes in the amount of output and in the spectral distribution of the output. On the other hand, since the present lamp may have only a single radiating fill component, or in accordance with an aspect of the invention have a fill which consists essentially of a sulfur containing substance or, a selenium containing substance, and an inert gas, any effect caused by the partial pressures of different fill components changing at different rates will not occur.

A further advantage of the lamp of the invention is that it may emit principally molecular as opposed to atomic radiation which results in a smoother spectrum without peaks or abrupt transitions and possibly a better color rendering index. In this regard it is noted that non-metals have found little application as fill materials in the prior art, and one reason for this is that the primary atomic spectral lines of the non-metals do not lie in the visible region. However, the present invention, at least in certain implementations relies on molecular radiation as the dominant source, and is able to provide radiation principally within the visible range. A unique feature of the lamp of the present invention may be that it is a high luminous efficacy lamp which emits principally molecular radiation.

A still further advantage of the electrodeless lamp embodiment of the invention is that it is a compact, high power, visible radiator. Thus, the diameter of the bulb is typically only 2–3 cm, while outputs of about 140 lumens/watt or greater are possible.

Figure 2:
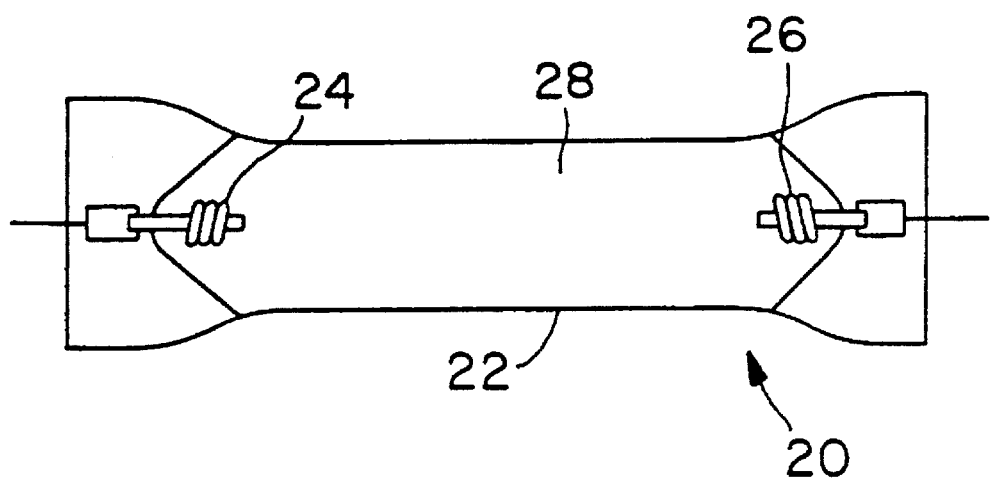
FIG. 2 shows a further embodiment of the invention.

A further embodiment of the invention is shown in FIG. 2. This is an arc lamp 20 which is comprised of quartz envelope 22 having electrodes 24 and 26, and containing fill 28. To excite the fill, an A.C. voltage is impressed across the electrodes, whereupon an arc discharge occurs therebetween In accordance with the invention, the fill in envelope 22 includes a sulfur containing substance or a selenium containing substance. In accordance with an aspect of the invention, this fill substance is the primary radiating component in the fill. The substance may be element sulfur or selenium, or compounds or these elements. Additionally, a small amount of an additional gas to aid in starting is provided, which can be an inert gas, such as argon or xenon.

As in the case of the electrodeless lamp, the fill is present at a high pressure of at least about 1 atmosphere and preferably in the range of about 2–20 atmospheres. This pressure is controlled mainly by the sulfur, or selenium containing substance, the partial pressure of which is at least about 1 atmosphere. Additionally, an electrical voltage is applied across the electrodes such that a power density of at least 60 watts/cm, exists. The electrodes 22 and 24 are made of or plated with a special material, such as platinum, to prevent chemical reactions with the fill gas, which may lead to electrode deterioration. Electrode materials other than platinum, which do not react with the fill gas, may be used.

In one implementation of the invention, the fill of either an electrodeless or arc lamp is arranged so that sulfur or selenium containing substance, is the sole radiating component in the bulb fill. In such an implementation, the sulfur, selenium, or phosphorous, or compound, may be the only substance in the fill except for a small amount of a gas to aid starting, e.g., argon or xenon.

Figure 3:
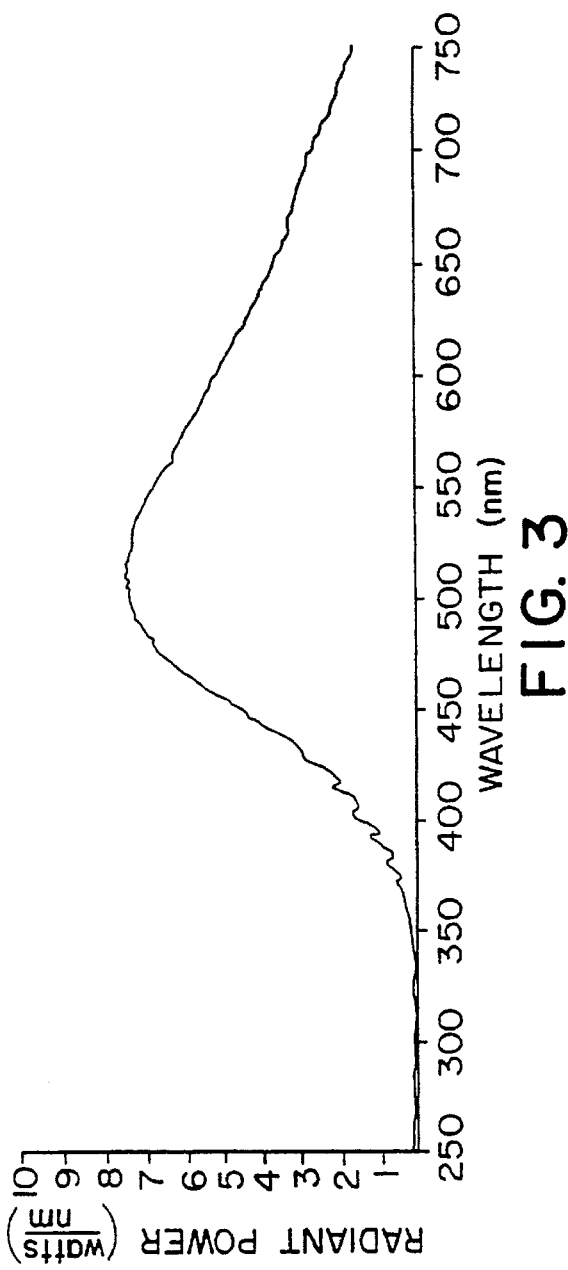
FIG. 3 is a spectral plot for an electrodeless lamp utilizing a sulfur bulb fill.

As a specific example of the invention, an electrodeless quartz bulb of spherical shape having an internal diameter of 2.84 cm was filled with 0.062 mg-moles/cc of sulfur, and 60 torr of argon. When the bulb was placed in a microwave cavity and excited with microwave energy at a power density of about 280 watts/cc, visible light was emitted having a spectrum as shown in FIG. 3. The luminous efficiency of the lamp was about 140 lumens/watt. Additionally, it is noted from the spectrum that there is minimal UV radiation beneath 350 nm. This feature helps to increase the luminous efficacy of the lamp and also enhances the safety of the lamp, as UV radiation is a health hazard. It is also noted from FIG. 3 that the spectral plot is smooth and does not contain sharp peaks, which results from the fact that the lamp is principally a molecular as opposed to an atomic radiator.

Figure 4:
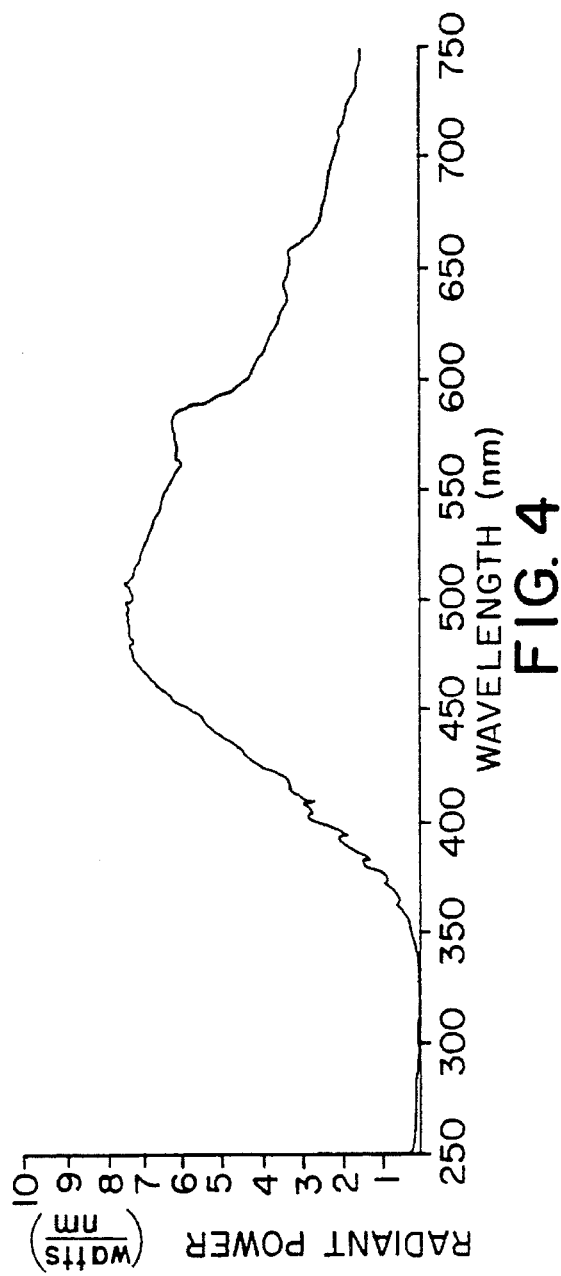
FIG. 4 is a spectral plot for an electrodeless lamp utilizing a bulb fill containing sulfur and cadmium iodide.

As a further specific example of the invention, an electrodeless bulb of spherical shape having an internal diameter of 2.84 cm was filled with 0.053 mg-moles/cc of sulfur, 0.008 mg-moles/cc of cadmium and 0.003 mg-moles/cc of cadmium iodide. When the lamp was excited with microwave energy at a power density of 280 watts/cc, visible light was emitted having a spectrum as shown in FIG. 4. The luminous efficacy of the lamp was about 134 lumens/watt. Additionally, it is noted that the spectrum has a shoulder at 580 nm, which is caused by the CdS and another shoulder at 650 nm, which is caused by the CdT.

A new, high power lamp which can be made without mercury has thus been disclosed. While the lamp has been described primarily as a high power visible source of illumination, certain implementations may find use in other areas of the spectrum, e.g., the U.V. Additionally, while the invention has been illustrated in accordance with specific embodiments, it should be understood that variations falling within the spirit of the invention will occur to those skilled in the art, and the invention is to be limited only by the claims which are appended hereto and equivalents.

We claim:

1. A lamp bulb for providing visible radiation, comprising, a light transmissive envelope, and a fill in said envelope including elemental selenium in gaseous form which is obtained when said fill is excited by sufficient power in operation, in an amount such that the excited fill emits radiation from the elemental selenium with substantially all of the radiation from the elemental selenium being emitted in a continuous band principally within the visible range.

2. The lamp bulb of claim 1 in combination with, means for exciting said fill with sufficient power to cause said elemental selenium to emit said radiation substantially all of which is emitted in a continuous band principally within the visible range.

3. The apparatus of claim 2 wherein said means for exciting applies microwave or r.f. power to the fill.

4. The apparatus of claim 3 wherein said bulb is electrodeless.

5. The apparatus of claim 2 wherein said elemental selenium emits more visible radiation than any other component of the fill.

6. The apparatus of claim 2 wherein the visible radiation which is emitted from the elemental selenium is molecular radiation.

7. The apparatus of claim 2 wherein the pressure of the fill during operation is at least about one atmosphere.

8. The apparatus of claim 7 wherein the fill pressure is controlled primarily by the elemental selenium.

9. The apparatus of claim 8 wherein said means for exciting applies microwave or r.f. power to the fill at a power density of at least about 50 watts/cc.

10. The apparatus of claim 2 wherein said bulb includes electrodes.

11. A lamp for providing visible radiation, comprising, a light transmissive envelope, a fill enclosed in said envelope which includes elemental selenium when excited, which elemental selenium is present during excitation in an amount such that when said fill is excited by sufficient microwave or r.f. power, the excited fill emits radiation from the elemental selenium with substantially all of the radiation from the elemental selenium being emitted in a continuous band principally within the visible range and with most of the visible radiation emitted by the fill being provided by the elemental selenium, and means for exciting said fill with sufficient microwave or r.f. power so that said elemental selenium emits said radiation substantially all of which is in a continuous band principally within the visible range.

12. The lamp of claim 11 wherein said fill further includes a starting gas.

13. A lamp for providing visible radiation, comprising, a light transmissive envelope, a fill enclosed in said envelope which includes elemental sulfur when excited, which elemental sulfur is present during excitation in an amount such that when said fill is excited by sufficient microwave or r.f. power, the excited fill emits radiation from the elemental sulfur with substantially all of the radiation from the elemental sulfur being emitted in a continuous band principally within the visible range and with most of the visible radiation emitted by the fill being provided by the elemental sulfur, and means for exciting said fill with sufficient microwave or r.f. power so that said elemental sulfur emits said radiation substantially all of which is emitted in a continuous band principally within the visible range.

14. A lamp bulb for providing visible radiation, comprising, a light transmissive envelope, and a fill in the envelope which contains elemental selenium and elemental sulfur when excited, which are present in amounts during excitation such that when the fill is excited with sufficient power, the excited fill emits visible radiation from the elemental selenium and from the elemental sulfur with substantially all of the radiation from each of the elemental sulfur and the elemental selenium being emitted in a continuous band principally within the visible range.

15. An apparatus comprised of the lamp bulb of claim 14 in combination with;

means for exciting said fill with sufficient power to cause said elemental selenium and said elemental sulfur to emit said radiation, substantially all of which is in a continuous band within the visible range.

16. The apparatus of claim 15 wherein the pressure of the fill at operating is at least about one atmosphere.

\* \* \* \* \*